(12) United States Patent
Rossi et al.

(10) Patent No.: US 11,324,136 B2
(45) Date of Patent: May 3, 2022

(54) HOUSING STRUCTURE FOR ELECTRONIC BOARDS

(71) Applicant: EUROTECH S.p.A., Amaro (IT)

(72) Inventors: Mauro Rossi, Gemona del Friuli (IT); Ugo Padulosi, Martignacco (IT); Gianpaolo Zanier, Lauco (IT)

(73) Assignee: EUROTECH S.P.A., Amaro (IT)

( * ) Notice: Subject to any disclaimer, the term of this patent is extended or adjusted under 35 U.S.C. 154(b) by 57 days.

(21) Appl. No.: 16/966,545

(22) PCT Filed: Jan. 31, 2019

(86) PCT No.: PCT/IT2019/050024
§ 371 (c)(1),
(2) Date: Jul. 31, 2020

(87) PCT Pub. No.: WO2019/150407
PCT Pub. Date: Aug. 8, 2019

(65) Prior Publication Data
US 2021/0051813 A1    Feb. 18, 2021

(30) Foreign Application Priority Data

Feb. 1, 2018    (IT) .......................... 102018000002318

(51) Int. Cl.
*H05K 7/14*    (2006.01)
*H05K 7/20*    (2006.01)
*G06F 1/18*    (2006.01)

(52) U.S. Cl.
CPC ......... *H05K 7/1402* (2013.01); *H05K 7/1424* (2013.01); *H05K 7/1461* (2013.01);
(Continued)

(58) Field of Classification Search
None
See application file for complete search history.

(56) References Cited

U.S. PATENT DOCUMENTS

| 4,493,010 A * | 1/1985 | Morrison | ........... H05K 7/20681 |
| | | | 361/698 |
| 4,916,575 A | 4/1990 | Van Asten | |

(Continued)

FOREIGN PATENT DOCUMENTS

FR    2764473    12/1998

OTHER PUBLICATIONS

International Search Report and Written Opinion from PCT/IT2019/050024 dated May 17, 2019.

*Primary Examiner* — James Wu
*Assistant Examiner* — Christopher L Augustin
(74) *Attorney, Agent, or Firm* — Calfee Halter & Griswold LLP

(57) ABSTRACT

Housing structure for PCI Express expansion electronic boards able to mechanically stabilize said PCI Express expansion electronic boards so as to guarantee the correct functioning, performance and integrity of the electric interconnection between them and the basic electronic board to which they are connected if there are mechanical stresses such as knocks or vibrations, in order to be able to use PCI Express expansion electronic boards in the automotive field, or in scenarios characterized by perturbations of the important mechanical type. The present invention also concerns an assembly method of the housing structure.

9 Claims, 4 Drawing Sheets

(52) U.S. Cl.
CPC ..... *H05K 7/20636* (2013.01); *H05K 7/20672* (2013.01); *G06F 1/183* (2013.01)

(56) References Cited

U.S. PATENT DOCUMENTS

| | | | |
|---|---|---|---|
| 5,822,193 | A | 10/1998 | Summers et al. |
| 6,151,215 | A | 11/2000 | Hoffman |
| 6,350,950 | B1 | 2/2002 | Barbier |
| 6,396,685 | B1 * | 5/2002 | Chien ............... G06F 1/184 312/223.2 |
| 6,409,518 | B1 * | 6/2002 | Hung ............... G06F 1/184 361/801 |
| 6,442,037 | B1 * | 8/2002 | Boe ............... H05K 7/1408 361/679.32 |
| 6,497,398 | B1 * | 12/2002 | Chuang ........... H05K 7/1408 248/694 |
| 6,616,469 | B2 * | 9/2003 | Goodwin ......... H05K 7/20636 257/E23.098 |
| 6,934,161 | B2 * | 8/2005 | Kim ............... G06F 1/184 361/695 |
| 10,813,245 | B2 * | 10/2020 | Liu ............... H05K 7/20727 |
| 2004/0190228 | A1 * | 9/2004 | Shi ............... G06F 1/184 361/539 |
| 2011/0289768 | A1 * | 12/2011 | Cheng ........... G06F 1/185 29/739 |
| 2012/0021624 | A1 * | 1/2012 | Tuma ............. G06F 1/185 439/76.1 |
| 2016/0291651 | A1 * | 10/2016 | Rossi ............. H05K 7/20772 |

* cited by examiner

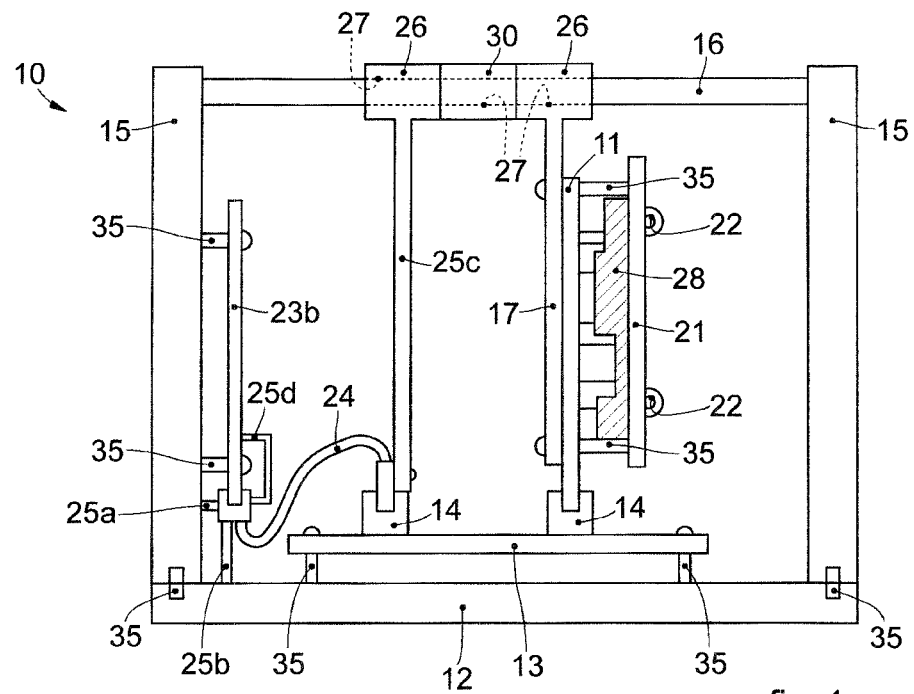
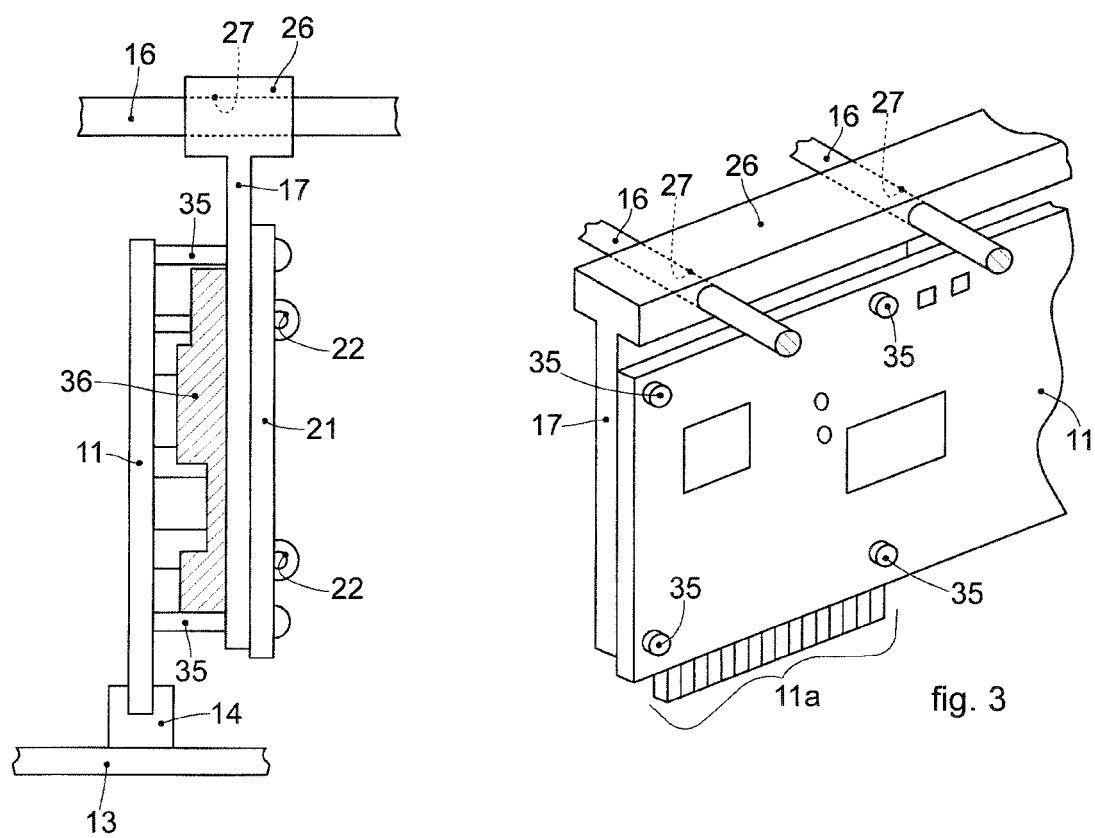
fig. 1
fig. 2
fig. 3

HOUSING STRUCTURE FOR ELECTRONIC BOARDS

RELATED APPLICATIONS

The present application is a 35 U.S.C. 371 U.S. national stage application entry of PCT International Application No. PCT/IT2019/050024, filed on Jan. 31, 2019, which claims the benefit of Italian Patent Application No. 102018000002318, filed Feb. 1, 2018, the entire disclosures of which are incorporated herein by reference.

FIELD OF THE INVENTION

Embodiments of the present invention concern a housing structure for PCI Express (Peripheral Component Interconnect Express) standard electronic boards, in particular those electronic boards used in high-performance processing units, supercomputers, or supercomputing systems (High-performance Computing).

In particular, the present invention concerns a housing structure for PCI Express electronic expansion boards (PCIe add-in cards) usable in the automotive field, for example installable in a car, or usable in other areas characterized by multiple stresses of the mechanical type.

BACKGROUND OF THE INVENTION

It is known that one of the main aspects on which the automotive industry is concentrating its investments is the possibility of performing multiple and complex functions in a coordinated manner.

These functions can comprise the processing of data collected in order to be able to perform specific functions autonomously, including driving the vehicle itself, or also functions of monitoring both the external environment, the vehicle and also the passengers.

The need to perform these functions very quickly is evident.

The complexity and the high number of functions to be performed, as well as the performances to be achieved in this context, require the use of high-performance processing units.

High-performance processing units that are able to perform this type of function, collecting and processing large amounts of data quickly, are available in sectors such as servers, datacenters, or suchlike.

These processing units typically provide a plurality of high-performance electronic boards, whether they are calculation or communication boards, each of which is connected by means of electric connectors to a motherboard, or a midplane board, or a similar board, suitable to manage and coordinate its functioning.

These high-performance electronic boards, in particular the latest generation models, are often made available in various formats and standards, of both form factor and interconnection. One of the main standards used is represented by the PCIe add-in cards with the relative connector on the board (edge-board connector or edge-finger) so that they can be inserted on the electric housing connectors on the basic electronic board.

Although the use of last-generation PCIe add-in cards in automotive applications is sought after, it is known that their use is made difficult by the fact that the mechanical-electric interconnection of the standard PCI Express is particularly sensitive to the influence of mechanical shocks and vibrations that can put the integrity and reliability of the electric connection at risk.

It is known that PCIe add-in cards are designed to operate in static or quasi-static conditions and are therefore unsuitable in areas such as the automotive field, where there are multiple types of stresses of a mechanical type, even severe.

These disadvantages have consolidated in the industry the belief that PCIe add-in cards cannot be used in these areas, despite the fact that they substantially integrate what is sought in terms of computing power and interconnection speed and are suitable to create modular and flexible architectures.

There is therefore a need to perfect the state of the art and make a solution available that allows to use PCIe add-in cards already available in the automotive field.

In particular, the present invention is intended to provide a housing structure for PCIe add-in cards which can be used in the automotive field, or in contexts characterized by the presence of mechanical stresses such as to put at risk the electric integrity of the interconnection between the PCIe add-in cards and the rest of the system.

One purpose of the present invention is to provide a housing structure which allows a plurality of PCIe add-in cards to be housed and held in the desired position, preventing the effect that the propagation and/or coupling of the mechanical vibrations acting on them would have on the quality of their electric interconnection to the rest of the system.

Another purpose of the present invention is to provide a housing structure which allows to use PCIe add-in cards and the supercomputing electronics correlated to them, typical of the server market, in the automotive field, so as to significantly reduce the time-to-market.

This result would allow to make available, in a short period of time, electronic boards suitable in terms of calculation, interconnection speed and already available on the market without needing to undertake long and costly stages of electronic redesign.

Another purpose is to re-propose what is already available on PCIe add-in cards in a solution intrinsically free from problems triggered by environments with considerable mechanical stresses.

Another purpose of the present invention is to provide a housing for PCIe add-in cards which also allows to use flexible PCI Express interconnection cabling if the PCIe add-in card needs to be made spatially remote, that is, not directly inserted into the female connector of the slot intended to receive it, but positioned in another suitable location, guaranteeing its electric interconnection.

Another purpose of the present invention is to provide a housing structure that allows the rapid and safe installation of PCIe add-in cards, which also have form factors that are different in height (full-height, half-height), or in length.

Another purpose of the present invention is to provide a housing structure for PCIe add-in cards which allows to suitably cool each of them while being held in the desired position and without being affected by the effects of mechanical stresses, at the same time maximizing the computing power density per volume unit and the speed of communication. This is very important in the automotive field because the systems need to be small in size so as to be easily integrated into the cars without taking up too much space.

Another purpose of the present invention is to provide a housing structure for PCIe add-in cards which allows easy assembly and maintenance, in compliance with the requirements of immunity to the effects of mechanical stresses.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purposes, the present invention concerns a housing structure for PCIe add-in cards comprising a base, at least a pair of lateral supports disposed parallel to the longitudinal orientation of the PCIe add-in cards, opposite each other and attached to the base, at least one rod connected between the pair of lateral supports and at least one holding element connected to the rod and integrally coupled with at least one of the PCIe add-in cards.

On the base at least one basic electronic board can be attached, provided with a plurality of electric housing connectors each able to be connected to a connection portion to connect one of the PCIe add-in cards to the basic electronic board.

According to possible embodiments, the lateral supports are attached to the base and can be disposed on opposite sides of the basic electronic board, parallel to the orientation of the longitudinal axes of the electric housing connectors located thereon and able to house the PCIe add-in cards.

The rod is removably connected between the lateral supports and is located above the basic electronic board.

The holding elements are solidly coupled with respective PCIe add-in cards.

The coupling between the holding element and the corresponding PCIe add-in card is at least made by extending the latter near the portion involved in the connection, that is, the connector on the edge of the board (edge-board connector or edge-finger).

The holding element is connected to the rod to hold the PCIe add-in card rigidly in position, defining a single body with at least the base, the lateral supports and the rod.

The PCIe add-in card is coupled with an electric housing connector of the basic electronic board or, alternatively, the PCIe add-in card can be attached to the base and/or to at least one of the lateral supports, in this case called auxiliary electronic board, and interconnected with suitable flexible wiring (PCIe Extender) to the electric housing connectors exposed by the basic electronic board coupled with the base itself. The auxiliary electronic board can be, depending on its different function, also not interconnected to the electric housing connectors exposed on the basic electronic board attached to the base itself.

This solution allows to prevent the propagation and/or coupling of the mechanical vibrations generated, for example, during the use of a vehicle on which the housing structure is installed, to the PCI add-in cards.

In particular, the present solution provides to hold rigidly in position the PCI add-in cards so that they are integral with each other and in particular integral with the basic or auxiliary electronic boards that house them.

In this way, the entire structure has a "cage" conformation that is characterized by a single oscillation frequency and, therefore, prevents any perturbation on the electric contact between the PCIe add-in cards and the board housing them, so that they are all integral with each other and in particular integral with the basic electronic or auxiliary boards that house them.

According to possible embodiments, at least one of either the PCIe add-in cards or the auxiliary electronic boards is attached to one of the lateral supports.

This configuration simplifies the assembly of the structure itself, while at the same time optimizing the overall sizes, which are extremely limited.

According to possible embodiments, at least one of the auxiliary electronic boards is provided with PCI Express type electric connectors (whether they are male edge-board connectors or female connectors) connected to the PCI Express electric housing connectors present on the basic electronic board by flexible PCI Express extension cables, also called PCI Express extenders.

The PCI Express extension cable can be attached to the base and/or to a lateral support and/or to the rod and/or to the auxiliary electronic board by means of at least one mechanical support body to stabilize the reciprocal connection thereof.

The mechanical support body ensures the mechanical connection, and therefore also the electric connection, between the terminal of the PCI Express extension cable and the electric housing connector to which it is connected, even in the presence of mechanical vibrations generated, for example, by the automobile or its movement.

According to possible embodiments, the holding element can be in contact with the PCIe add-in card.

In this condition, the holding element can be configured to assist the dissipation of the heat generated, during use, by the active components present on the PCIe add-in card. For example, it can perform the function of a thermal interconnection element, such as an interposer, between the active elements to be dissipated and the dissipating element, whether it be a cooling plate through which a liquid flows or a heat sink or other.

According to possible solutions, the housing structure is provided with a cooling liquid distributor which can be connected to a cooling liquid supply circuit and provided with a plurality of nozzles connected in a rotatable manner to the distributor, or in an articulated manner in order to be able to orientate the nozzles in relation to needs.

The nozzles can be fluidically connected to respective cooling devices, such as for example cooling plates, by means of flexible connection pipes, said cooling devices being coupled with respective PCIe add-in cards in order to cool them.

Thanks to the presence of the nozzles, rotatably connected to the distributor and to the flexible connection pipes, it is possible to operate quickly and easily during the assembly or maintenance of the system, reducing to a minimum the need to decouple the sub-sections, and at the same time guaranteeing that the mechanical stresses to which the distributor could be subjected, in the embodiment in which it is not integral with the rest of the system, are not propagated through the connection pipes and cooling devices of the PCIe add-in cards.

According to possible solutions, the holding elements can act as a support for the cooling devices, whether they be cooling plates through which liquid passes, or heat sinks or other, so as to exploit the mechanical support of the former.

In accordance with possible embodiments, each of the holding elements comprises at least one connection portion provided with a through aperture in which the rod is inserted.

This embodiment simplifies the connection of the individual holding elements with the rod, since it is sufficient to insert the latter through the through apertures of the holding elements, the through apertures of which have their central axes aligned.

According to possible embodiments, the housing structure can comprise at least one spacer connected to the rod and located between two holding elements, or between one holding element and one of the lateral supports.

This embodiment allows to position the PCIe add-in cards at the desired distance without the need to insert PCIe add-in cards that are not required, or needed.

According to possible embodiments, at least one of the holding elements comprises an extension portion configured to extend the size of the holding element itself so that it can expose a through aperture in axis with the central axis of the rod and allow in this way the integral clamping thereof.

This solution also allows to connect in the same way the PCIe add-in cards of different sizes from each other, while guaranteeing at the same time that they are integrally connected to the holding element and therefore to the housing structure.

According to possible solutions, the present invention also concerns a method to assemble a housing structure for PCIe add-in cards which provides to:
  make available a base on which a basic electronic board is attached, provided with a plurality of electric housing connectors each able to connect one of the PCIe add-in cards to the basic electronic board,
  attach at least two lateral supports to the base, disposing them opposite each other and oriented parallel to the longitudinal axis of the electric housing connectors present on the basic electronic board,
  integrally couple at least one of the PCIe add-in cards with a respective holding element and connect the latter to at least one rod,
  connect the PCIe add-in card coupled with the holding element to one of the electric housing connectors of the basic electronic board,
  connect the rod to the holding element coupled with the PCIe add-in card, and attach the rod to the lateral supports, for example the connection of the rod to the holding element can be made by inserting the rod into the through aperture of the holding element,
  if necessary, before the operation of the previous step, an auxiliary electronic board can be coupled with one of the lateral supports and if this is a PCIe add-in card it can be connected to one of the electric housing connectors present on the basic electronic board via a PCIe flexible extender.

According to possible embodiments, the assembly method provides to couple with the PCIe add-in card at least one liquid cooling device, made integral with the holding element, and to connect it to respective nozzles, rotatably connected to a distributor, by means of flexible connection pipes.

In this case, the assembly method can provide to attach the holding element to the cooling device.

BRIEF DESCRIPTION OF THE DRAWINGS

These and other characteristics of the present invention will become apparent from the following description of some embodiments, given as a non-restrictive example with reference to the attached drawings wherein:

FIG. 1 is a schematic front view of a housing structure according to a possible embodiment of the present invention;

FIG. 2 is a front view of a schematic detail of a housing structure according to a possible embodiment of the invention;

FIG. 3 is a schematic perspective view of a holding element coupled with a PCIe add-in card according to a possible embodiment of the invention;

To facilitate comprehension, the same reference numbers have been used, where possible, to identify identical common elements in the drawings. It is understood that elements and characteristics of one embodiment can conveniently be incorporated into other embodiments without further clarifications.

DETAILED DESCRIPTION OF SOME EMBODIMENTS

Figure 4:
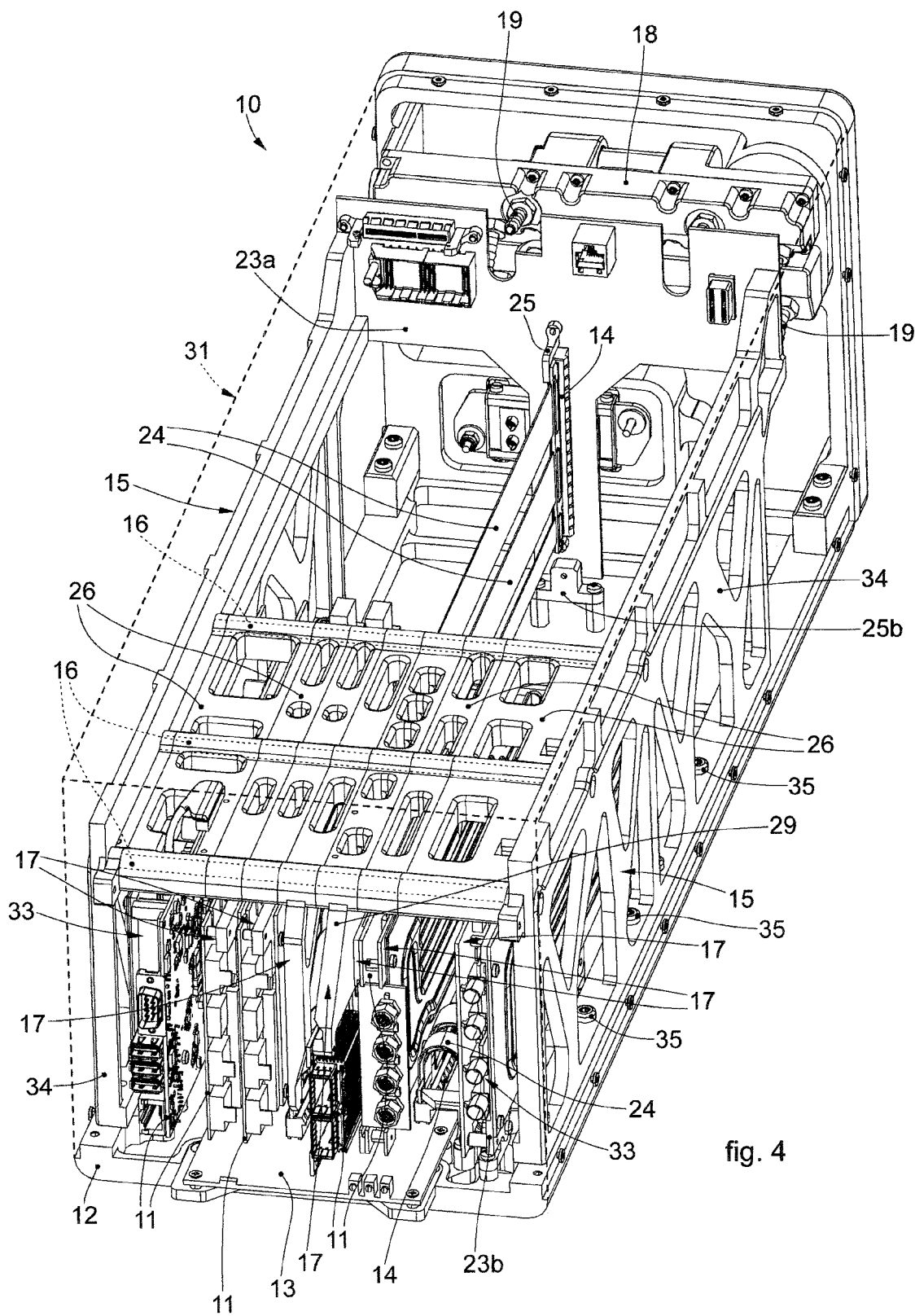
FIG. 4 is a schematic perspective view of a housing structure according to a possible embodiment of the invention.

With reference to FIGS. 1-7, which represent non-restrictive examples of the invention, we will now describe some embodiments of a housing structure 10 for PCIe add-in cards 11.

The housing structure 10 has been optimized to be able to use PCIe add-in cards 11 provided with at least one connection portion at the board edge 11a (edge-board connector or edge-finger), typically used in desktop, server, or other supercomputing applications, in fields characterized by multiple mechanical stresses, for example, in the automotive field.

The housing structure 10 is configured to prevent malfunctions or damage induced by the mechanical stresses between the individual PCIe add-in cards 11 and the host base circuit board 13.

In particular, the housing structure 10 allows to make the PCIe add-in cards 11 integral with it, so that, if the housing structure 10 is subjected to mechanical vibrations, the PCIe add-in cards 11 are brought under stress together with the housing structure 10 itself.

This allows to keep stable the electric connection between the connection portions at the board edge 11a (edge-board connector or edge-finger) of the PCIe add-in cards 11 with the corresponding electric housing connectors 14.

According to the present invention, the housing structure 10 comprises:
  a base 12 on which at least one basic electronic board 13 is attached, provided with a plurality of electric housing connectors 14 each connectable to the connection portion at the board edge 11a to connect one of the PCIe add-in cards 11 to the basic electronic board 13,
  at least two lateral supports 15 opposite one another, attached to the base 12 and oriented parallel to the longitudinal axis of the electric housing connectors 14 of the basic electronic board 13,
  at least one rod 16 removably connected between the lateral supports 15 and located above the basic electronic board 13, and
  at least one holding element 17 connected to the rod 16 and integrally coupled with at least one of the PCIe add-in cards 11 at least for the portion of the latter near which there is the connection portion at the board edge 11a (edge-board connector or edge-finger), said holding element 17 being configured to hold rigidly in position the PCIe add-in card 11 defining a single body with at least the base 12, the lateral supports 15 and the rod 16, said PCIe add-in card 11 being coupled with an electric housing connector 14 of the basic electronic board 13 or of another auxiliary electronic board 23a-23b attached to the base 12.

As required, a PCIe add-in card can also be attached to one of the lateral supports 15 and/or the base 12 instead of being inserted into the electric housing connectors 14 of the basic electronic board 13. In this case, the electronic expansion board is defined as auxiliary electronic board 23b.

If necessary, one of the auxiliary boards might not be an electronic PCI Express expansion board and can have a different function, here defined as auxiliary electronic board 23a, although it is in any case attached to the lateral supports 15 and/or the base 12.

According to possible embodiments, the basic electronic board 13 or the auxiliary electronic board 23a-23b can be attached to the base 12 and/or at least a lateral support 15 by suitable attachment elements 35, such as for example screws, pegs, or other attachment means.

The lateral supports 15 can also be attached to the base by suitable attachment elements 35.

The basic electronic board 13 can be a motherboard provided with a PCI Express slot 14, a midplane board carrying a PCI Express switch expanding various PCI Express slots 14, or another similar electronic board intended to perform one or more functions, housing, interconnecting and coordinating the PCIe add-in cards 11 connected to it.

According to possible embodiments, the two lateral supports 15 can comprise two lateral elements 33, attached or not attached to the base 12 and disposed outside the holding elements 17.

The lateral elements 33 can be configured substantially like the holding elements 17.

According to possible embodiments, at least one of the lateral supports 15 can consist of a lateral support body 34 disposed on the side of the electronic base board 13 and attached to the base 12.

The lateral support bodies 34 can have a plurality of apertures to lighten their weight.

According to possible embodiments, at least one of the lateral supports 15 can consist of only one lateral element 33 attached to the base 12 and disposed outside the holding elements 17.

If both lateral supports 15 consist of two lateral elements 33, the latter can be disposed opposite each other on the side of the holding elements 17.

According to possible embodiments, the lateral supports 15 can consist of a combination of one lateral element 33 and one lateral support body 34, both attached to the base 12, or only one of the two attached to the base 12, the two elements 33 and 34 in any case being integral with each other.

According to possible embodiments, at least one of either the PCIe add-in cards 11 or the auxiliary electronic boards 23a, 23b is attached to one of the lateral supports 15.

According to possible embodiments, the lateral supports 15, whether they are the lateral support bodies 34 attached to the base 12 and/or the lateral elements 33 attached to the base 12, develop along planes parallel to each other and orthogonal to the base 12.

According to possible solutions, the planes in which the lateral support bodies 34 develop are disposed on opposite sides to the basic electronic board 13, parallel to the orientation of the main axis of the electric housing connectors 14.

According to possible embodiments, at least one of the auxiliary electronic boards 23a, 23b is provided with electric housing connectors 14 and/or at least one connection portion at the board edge 11a (edge-board connector or edge-finger) that can be connected to the PCIe add-in card 11 or the basic electronic board 13 through PCI Express extension cables 24.

The PCI Express extension cable 24 can be a cable with male and/or female terminals.

Reference number 23a indicates a generic auxiliary electronic board, while reference number 23b indicates an auxiliary electronic board in the format of the PCIe add-in card.

Figure 5:
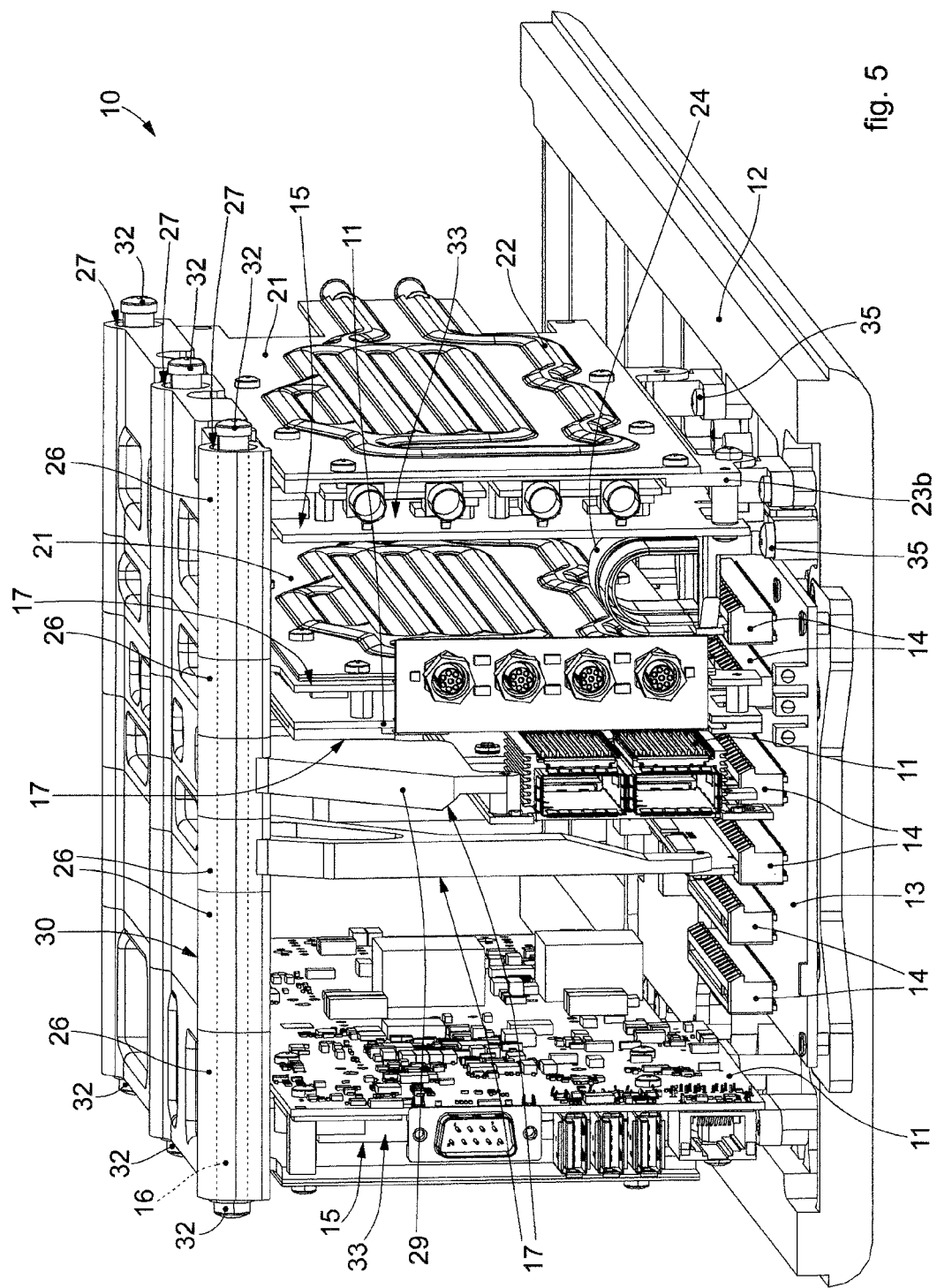
FIG. 5 is a front perspective view of a housing structure according to a possible embodiment of the present invention.
Figure 6:
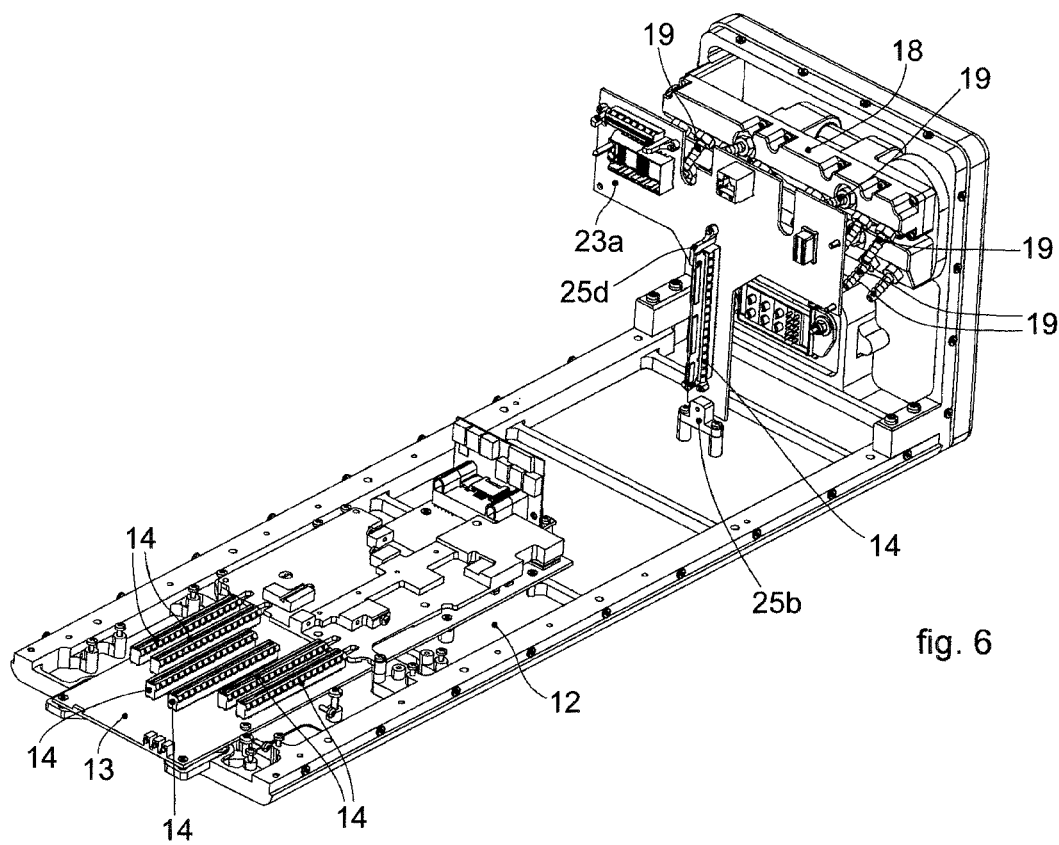
FIGS. 6 and 7 show a housing structure in two steps of an assembly sequence.
Figure 7:
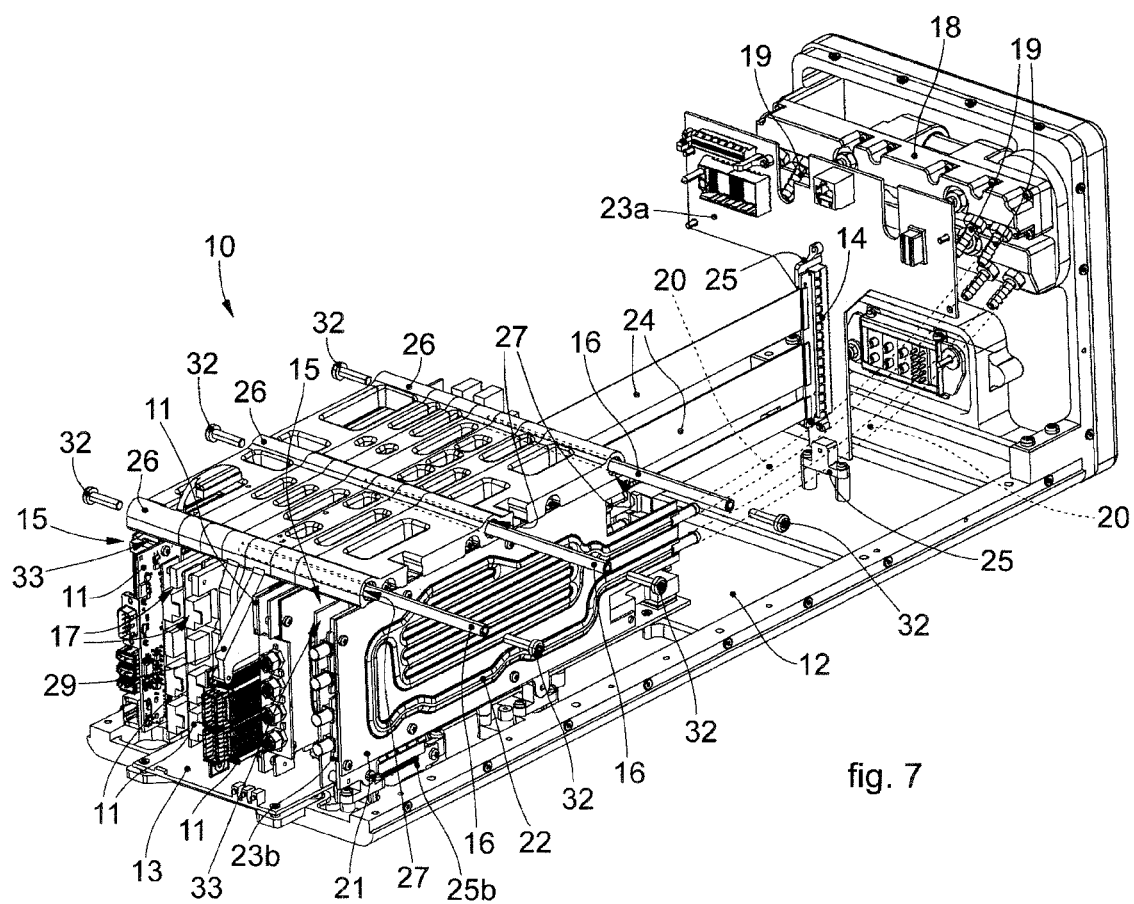

The auxiliary electronic board 23b in the format of the PCIe add-in card shown in FIGS. 4 and 5 is connected to the basic electronic board 13 and outside it by means of a PCI Express extension cable 24.

According to possible solutions, the PCI Express extension cables 24 can be advantageously flexible and are used to use the PCIe add-in cards 11 remotely.

The term "use remotely" refers to the possibility of installing a PCIe add-in card 11 in a position different from the PCI Express slot 14 provided on the basic electronic board 13.

This is advantageous if there is not enough space to put the PCIe add-in cards 11 adjacent to each other on the basic electronic board 13.

For example, this situation can arise if a base electronic circuit board 13 is not intended to be re-used for the specific application and therefore, for example, with a pitch between the electric housing connectors 14 insufficient to guarantee the contemporary housing of all the PCIe add-in cards. This allows to reduce both costs and time-to-market.

For example, the PCI Express extension cables 24 can be connected between an auxiliary electronic board 23b containing a PCIe add-in card and an electric housing connector 14 of the basic electronic board 13 not positioned in correspondence with the auxiliary electronic board 23b, that is, distanced from it.

In accordance with possible solutions, the PCI Express extension cable 24 is attached to the base 12 and/or to the lateral support 15 and/or to the rod 16 and/or to the auxiliary electronic board 23a, 23b by at least one mechanical support body 25a-25d to stabilize the reciprocal connection thereof.

In the drawings, reference number 25a indicates a mechanical support body which connects a female terminal of a PCI Express extension cable 24 to a lateral support 15.

In the drawings, reference number 25b indicates a mechanical support body which connects a female terminal of a PCI Express extension cable 24 to the base 12.

In the drawings, reference number 25c indicates a mechanical support body which connects a male terminal of a PCI Express extension cable 24 to the rod 16. In this case the mechanical support body 25c is substantially configured as a holding element 17.

In the drawings, reference number 25d indicates a mechanical support body which connects a female terminal of a PCI Express extension cable 24 to the auxiliary electronic board 23b, connected in turn to the lateral support 15.

Thanks to the presence of the mechanical support bodies 25a-25d, it is possible to integrally connect auxiliary electronic boards 23a-23b and to make the connection of the PCI Express extension cables 24 stable with the corresponding electric housing connectors 14 and/or with possible connectors at the board edge 11a on the auxiliary board 23b.

According to possible embodiments, the holding element 17 is located in contact with the PCIe add-in card 11 and is configured to dissipate the heat generated during use by the latter.

For example, as shown in FIG. 2, the holding element 17 can comprise a contact portion 36 conformed in a manner mating with the surface of the PCIe add-in card 11 at the level of the hot components, during use, which put in contact with the latter, distances the heat generated by directing it toward the dissipating element, which can be, for example, the cooling plate 21.

According to possible embodiments, the housing structure 10 is provided with a distributor 18 of cooling liquid which can be connected to a cooling liquid supply circuit.

According to possible embodiments, the distributor 18 is provided with a plurality of nozzles 19 rotatably connected to the distributor 18 itself and to respective holding elements 17 by means of flexible connection pipes 20 to distribute the cooling liquid to the PCIe add-in cards 11 and/or the auxiliary ones 23a-23b and/or the basic electronic board 13.

Thanks to the presence of rotatably connected nozzles 19 and to the flexible connection pipes 20, it is possible to easily connect the individual flexible connection pipes 20 in the desired position and without possible mechanical stresses being propagated through the same, to which stresses the distributor 18 could be subjected in the case of embodiments in which the distributor 18 is not integral with the housing structure 10.

According to possible embodiments, at least one of the PCIe add-in cards 11 can be associated with at least one cooling device 21 fluidically connected, in the case of cooling with liquid, to the distributor 18, in order to cool the card itself.

For example, the cooling device 21 can comprise a cooling plate associated with a possible thermal interconnection element 28, which acts as a thermal interposer.

The cooling device 21 can be located in contact with at least part of the surface of the PCIe add-in card 11, in particular at the level of the hot components, during use, of the electronic card itself.

The cooling device 21 can be provided with at least one channel 22 in which the cooling liquid flows.

According to possible embodiments, each of the holding elements 17 comprises at least one connection portion 26 provided with at least one through aperture 27 in which the rod 16 is inserted.

Each holding element 17 is conformed in such a way that, once installed, it has its through apertures 27 aligned with the through apertures 27 of the other holding elements 17.

This defines at least one pipe in which a rod 16 can be inserted so as to connect the holding elements 17 to the rod 16 itself and all with each other.

The rod 16 is fixed at its ends by suitable removable attachment means 32, such as for example screws, pegs, or other. For example, the rod 16 can be provided with two threaded holes made in correspondence with its ends, into which two screws can be inserted which are suitable to clamp together all the holding elements 17, creating a single integral body.

Once the holding elements 17 have been attached to each other and the rod 16 attached to the supports 15, in turn attached to the base 12, the assembly thus formed, in the case of mechanical stresses, such as impacts or vibrations, reacts substantially as if it was a single body.

According to possible embodiments, at least one of the holding elements 17 comprises an extension portion 29 configured to extend the connection between the rod 16 and the PCIe add-in card 11, that is, between the connection portion 26 and the PCIe add-in card 11.

This allows to house and make integral with each other even PCIe add-in cards 11 with different sizes: for example, it allows to install PCIe add-in cards 11 having a height smaller than the distance between the rod 16 and the electric housing connector 14 located on the basic electronic board 13.

According to possible embodiments, the housing structure 10 can comprise at least one spacer 30 connected to the rod 16 and located between two holding elements 17, or one holding element 17 and one of the two supports 15.

The spacer 30 can be substantially conformed as the connection portion 26 of the holding element 17, that is, it too can also have a through aperture 26.

Both the spacer 30 and the connection portion 26 can have different widths in relation to the bulk of the PCIe add-in cards 11 to be installed and the specific requirements to guarantee the clamping in position.

This embodiment allows to position, and then clamp together, the PCIe add-in cards 11 at the desired distance, keeping them in an orthogonal position with respect to the basic electronic board 13, without needing to insert unnecessary PCIe add-in cards 11, or required.

According to possible embodiments, the housing structure 10 can comprise a casing 31 located to cover it.

The casing 31 can comprise a front panel and a rear panel each provided with suitable connectors to be able to connect the basic electronic boards 13, the PCIe add-in cards 11, the auxiliary electronic boards 23a-23b, the distributor 18 of cooling liquid, or other additional units outside the casing 31.

According to possible solutions, the present invention also concerns a method to assemble the housing structure 10 for PCIe add-in cards 11 which provides:

to make available a base 12 on which a basic electronic board 13 is attached, provided with a plurality of electric housing connectors 14 each able to connect one of the PCIe add-in cards to the basic electronic board 13, to attach at least two lateral supports 15 to the base 12, disposing them opposite each other and oriented parallel to the direction of development of the longitudinal axis of the electric housing connectors 14 present on the basic electronic board 13, to integrally couple at least one of the PCIe add-in cards 11 with a holding element 17, to connect the PCIe add-in card 11 coupled with the respective holding element 17 to one of the electric housing connectors 14 of the basic electronic board 13 or of another auxiliary electronic board 23a, 23b attached to the base 12 and/or to at least one of the lateral supports 15, to connect the rod 16 to the holding element 17 coupled with the PCIe add-in card 11, and attach the rod 16 to the lateral supports 15: for example, the connection of the rod to the holding element can be made by inserting the rod 16 into the through aperture 27 of the holding element 17, if necessary, before the previous step, an auxiliary electronic board 23b can be coupled with at least one lateral support 15 and if the same is a PCIe add-in card it can be connected to one of the electric housing connectors 14 on the basic electronic board 13 by means of a PCI Express extension cable 24.

According to possible embodiments, the assembly process can provide to couple with the PCIe add-in cards 11 at least one cooling device 21 and to connect it to respective nozzles 19, connected rotatably to the distributor 18, by means of flexible connection pipes 20.

It is clear that modifications and/or additions of parts can be made to the housing structure 10 and the respective assembly method as described heretofore, without departing from the field and scope of the present invention.

It is also clear that, although the present invention has been described with reference to some specific examples, a person of skill in the art shall certainly be able to achieve many other equivalent forms of housing structure 10 and the respective assembly method, having the characteristics as set forth in the claims and hence all coming within the field of protection defined thereby.

The invention claimed is:

1. A housing structure for PCI Express expansion electronic boards provided with at least a connection portion at a board edge, comprising:
    a base on which at least a basic electronic board is attached, provided with a plurality of electric housing connectors each connectable to said connection portion at the board edge in order to connect one of said PCI Express expansion electronic boards to said basic electronic board,
    at least two lateral supports, opposite each other, attached to said base and oriented parallel to a longitudinal axis of said electric housing connectors of said basic electronic board,
    at least a rod removably connected between said lateral supports and located above said basic electronic board, and
    at least a holding element connected to said rod and solidly coupled with at least one of said PCI Express expansion electronic boards at least in proximity to said connection portion at the board edge of the latter, said holding element being configured to rigidly hold in position said PCI Express expansion electronic board, defining a single body with at least said base, said lateral supports and said rod, said PCI Express expansion electronic board being coupled with one of the electric housing connectors of said basic electronic board,
    wherein each of said holding elements comprises at least a connection portion provided with at least a through aperture in which said rod is inserted.

2. The housing structure as in claim 1, wherein at least one of either said PCI Express expansion electronic boards or auxiliary electronic boards is attached to one of said lateral supports.

3. The housing structure as in claim 2, wherein at least one of said auxiliary electronic boards is provided with electric housing connectors and/or at least one connection portion at the board edge connected to said electric housing connectors present on said basic electronic board by means of PCI Express extension cables, wherein said PCI Express extension cable is attached to said base and/or said lateral support and/or said rod and/or said auxiliary electronic board by means of at least one mechanical support body to stabilize the reciprocal connection.

4. The housing structure as in claim 1, wherein said holding element is put in contact with said PCI Express expansion electronic board and is also configured to take active part in the dissipation of the heat generated by the latter during use, promoting the transfer thereof to a cooling device.

5. The housing structure as in claim 1, further comprising a distributor of cooling liquid, connectable to a cooling liquid feed circuit and provided with a plurality of nozzles rotatably connected to said distributor and fluidically connected to respective cooling devices by means of flexible connection pipes, wherein each of said cooling devices is coupled with one of said PCI Express expansion electronic boards and/or auxiliary electronic boards and/or said basic electronic board in order to cool them.

6. The housing structure as in claim 1, wherein at least one of said holding elements comprises an extension portion configured to extend the connection between said rod and said PCI Express expansion electronic board.

7. The housing structure as in claim 1, further comprising at least a spacer connected to said rod and located between two holding elements, or one holding element and one of said lateral supports.

8. A method to assemble the housing structure as in claim 1, comprising:
    making available the base on which the basic electronic board is attached, provided with the plurality of electric housing connectors each able to connect one of said PCI Express expansion electronic boards to said basic electronic board,
    attaching said at least two lateral supports to said base, disposing them opposite each other and orienting them parallel to the longitudinal axis of said electric housing connectors of said basic electronic board,
    solidly coupling the at least one of said PCI Express expansion electronic boards to the holding element and connect the latter to at least the rod, connecting said PCI Express expansion electronic board to one of said electric housing connectors of said basic electronic board attached to said base,
    attaching said rod between said lateral supports and above said basic electronic board.

9. The method as in claim 8, further comprising: connecting at least one auxiliary electronic board to at least one of said lateral supports and to interconnect it in one of said housing connectors of said basic electronic board attached to said base.

* * * * *